United States Patent [19]
Peng

[11] Patent Number: 6,128,070
[45] Date of Patent: Oct. 3, 2000

[54] MONITOR METHOD AND APPARATUS FOR OVERLAY ALIGNMENT OF A STEPPER

[75] Inventor: Hsin-Tang Peng, Hsinchu, Taiwan

[73] Assignee: Mosel Vitelic Inc., Hsinchu, Taiwan

[21] Appl. No.: 09/310,150

[22] Filed: May 12, 1999

[30] Foreign Application Priority Data

Mar. 26, 1999 [TW] Taiwan .................................. 88104783

[51] Int. Cl.$^7$ ........................... G03B 27/42; G03B 27/32; G03C 9/00; G03C 5/00
[52] U.S. Cl. ................................. 355/53; 355/77; 430/22; 430/30
[58] Field of Search .................................. 355/52, 53, 67, 355/77; 356/399–401; 430/5, 20, 22, 30

[56] References Cited

U.S. PATENT DOCUMENTS

| | | | |
|---|---|---|---|
| 5,601,957 | 2/1997 | Mizutani et al. | 430/22 |
| 5,715,063 | 2/1998 | Ota | 356/400 |
| 5,894,350 | 4/1999 | Hsieh et al. | 356/399 |
| 6,011,611 | 1/2000 | Nomura et al. | 355/67 |

Primary Examiner—Eddie C. Lee
Assistant Examiner—Hung Henry Nguyen
Attorney, Agent, or Firm—Bacon & Thomas

[57] ABSTRACT

A monitor method and apparatus for overlay alignment of a stepper includes a reticle having a plurality of align marks for the stepper to expose a plurality of stepping exposing patterns on an initial layer of a wafer in a step-and-repeat manner. Each subsequent stepping exposing pattern has at least one align mark overlaying with one of the align marks of a previous/adjacent stepping exposing pattern. A triangle geometric equation may be used to calculate the deviation angle resulting from stepping direction and reticle position (e.g., reticle skew angle) so that overlay accuracy against the initial layer may be monitored effectively for enhancing wafer production yield.

20 Claims, 4 Drawing Sheets

MONITOR METHOD AND APPARATUS FOR OVERLAY ALIGNMENT OF A STEPPER

BACKGROUND OF THE INVENTION

1. Field of the Invention

This invention relates to monitor method and apparatus for overlay alignment of a stepper and particularly to a stepper and a reticle means used in exposing process for semiconductor manufacturing process to perform real time overlay alignment monitor when exposing a first layer pattern on a wafer.

2. Description of the Prior Art

In manufacturing process of integrated circuit (IC), one of the frequently used operations is to transfer circuit layout pattern to a wafer by means of microphoto techniques. One of the techniques is to make the circuit layout as a pattern on a reticle and uses a stepper to expose a wafer covered with a photoresist through the reticle in a stepping and repeating manner. The stepping and repeating manner means the reticle is being moved at a predetermined distance at a time and stop, and then exposing operation is performed. After that the reticle is moved again to repeat another cycle of operation set forth above until the circuit layout pattern has been transferred to the whole wafer surface.

In the IC manufacturing process, many layers of circuit layout are formed overlayed in the wafer at predetermined locations. The accuracy of overlaying greatly affects the IC electricity property, stability, reliability, and the yield of IC production. Thus enhancing microphoto technique is a heavily focused task in IC manufacturing industry. A lot of references regard "Pattern Alignment" technique have been disclosed. The "Pattern Alignment" technique includes mainly "Reticle Mark Alignment" and "Process Automatic Alignment" techniques.

According to the "Reticle Mark Alignment" technique, a plurality of Marks are provided on the reticle. The marks are transferred to the wafer through exposing (micro photo) process of a designated layer. When proceeding the exposing process of the reticle pattern of a subsequent layer, the stepper will locate or recognize the marks of a previous layer, and align the marks of an upper layer against a lower layer.

The "Process Automatic Alignment" technique forms a "Shield Layer" made of selected material (such as nitrous silicon) in a selected pattern on the wafer surface. This "Shield Layer" becomes a mask for the subsequent process and automatically aligns with the pattern of the previous layer. It thus saves at least one process step of spreading photoresist and reticle exposing when forming and self-aligning an upper layer circuit against a low layer circuit. Nevertheless all the techniques set forth above mainly focus how to align "an upper layer pattern" against "a lower layer pattern". They rarely address the overlaying accuracy of exposing pattern of the "initial layer" when using the stepper. It is generally known that the alignment accuracy of the initial layer directly affects the alignment accuracy of subsequent layers. Although the "Reticle Mark Alignment" technique may automatically provides positioning alignment function within a small error range, it does not adequately cover the initial pattern alignment. The accuracy of the initial layer alignment thus becomes a problem and will increase positioning error of subsequent pattern overlaying.

Conventional method of using the stepper for enhancing pattern overlay accuracy for the initial layer mainly address two areas: one is to enhance stepper precision to get better exposing accuracy. Another one is to perform periodical maintenance and parameter adjustment of the stepper. A "maintenance reticle" is placed in the stepper periodically (such as once in a number of weeks or months) for exposing a testing wafer to get the overlay error value. Then software parameters in the stepper are changed to correct the overlay error. The conventional method set forth above has the following disadvantages:

1. Periodical Maintenance (PM) approach does not meet "Real-Time Monitor" requirement in the production line. The "Maintenance Reticle" usually uses standard size and pattern which do not fit production of different size and pattern reticle. The alignment accuracy is thus not satisfactory.
2. The adverse effect of lower accuracy of subsequent layers resulting from the alignment error of the "Initial Layer" cannot be totally eliminated. The alignment error of the initial layer comes from the moving error of the stepper or angular skew when placing the reticle in the stepper. That error deviation cannot be detected real time. Hence the positioning accuracy of subsequent layers based on the initial layer cannot be better than the initial layer. In most cases, the alignment error in the subsequent layers will aggregate and becomes worse. This phenomenon makes production and quality control very difficult and complicated, and can easily drag down the yield.
3. "Periodical Maintenance" usually cannot meet production requirements, particularly when a lot of equipments and facilitates from different vendors are involved. They may have different maintenance requirements and cycle, and are difficult to schedule. Prolong downtime resulting from maintenance causes yield drop and increases production cost.
4. Overlay alignment of mix and match among same type of equipments is difficult. Conventional method uses maintenance reticle of standard dimension and pattern. When there is need for mix and match overlay alignment between equipments for different size or pattern of reticle, it is very difficult to get the accuracy desired.

SUMMARY OF THE INVENTION

In view of aforesaid disadvantages, it is therefore an object of this invention to provide a monitor method and apparatus for overlay alignment of a stepper so that real time overlay alignment monitoring may be performed for the first (i.e., initial) layer pattern exposing process and resolves the problems of conventional method mentioned above.

It is another object of this invention to provide a method and apparatus for overlay alignment of a stepper that builds a real time overlay alignment function in the production process for constantly monitoring the alignment status and conditions of the stepper. And base on this, stepper adjustment may be made instantly to get the results desired. Furthermore periodical maintenance cycle for equipments may be set and adjusted at an optimal level. The apparatus according to this invention includes a reticle means which has a special align mark. The reticle means may be built in the exposing process of general products without a "Maintenance Reticle" of standard dimension and pattern. Hence, the reticle of this invention may be made at different size and pattern base on requirements. It is more flexible. The mix and match of overlay alignment thus is possible. It also may respond to stepping exposing pattern of different size to meet the requirements of stepping overlay alignment.

The monitor method according to this invention includes the following steps:

a. Forming a rectangular-shaped first stepping exposing pattern on a base member through the stepper. The first stepping exposing pattern includes at least a first align mark and a second align mark located respectively at a center point of two opposite sides of the first stepping exposing pattern. The first and second align marks define a first straight line crossing the center line of the first stepping exposing pattern.

b. Forming a second stepping exposing pattern on the base member by means of the stepper at a selected distance (ΔX) from the first stepping exposing pattern along a second straight line. The second stepping exposing pattern is substantially same as the first stepping exposing pattern and also has a first align mark and a second align mark. The moving distance of the second stepping exposing pattern is such that the first align mark of the second stepping exposing pattern overlays with the second alignment mark of the first stepping exposing pattern. Defining a third straight line normal to the second straight line.

c. Locating the center point of the first align mark of the second stepping exposing pattern. Projecting the center point on the first straight line along the third straight line. The projection distance is ΔY.

d. Getting an angle based on the following equation:

$$\theta = \tan^{-1} \frac{\Delta Y}{\Delta X}$$

Where θ is the angle formed by the first and second straight line. It is also the angular deviation when the stepper overlays the pattern.

The reticle means of this invention includes a rectangular frame with a rectangular light penetrable zone located therein. The stepper forms the stepping exposing pattern on the base member through the light penetrable zone by means of exposing process. At least one circuit pattern is formed in the light penetrable zone. An interval is formed between the outside edges of the circuit layout pattern and the inside rim of the frame.

At least two align marks are respectively located at the center points of two opposite sides of the interval in the light penetrable zone. The two align marks define the first straight line.

When the stepper performs exposing process on the base member through the reticle, the circuit layout pattern and the align marks are transferred to the base member at the same time. And at least one of the align marks at one pattern overlays with one of the align marks of an adjacent pattern when a plurality of patterns are formed on the base member during the "step and repeat" exposing process of the stepper.

BRIEF DESCRIPTION OF THE DRAWINGS

The invention, as well as its many advantages, may be further understood by the following detailed description and drawings in which.

DETAILED DESCRIPTION OF THE PREFERRED EMBODIMENT

The method and apparatus according to this invention sets a plurality of align marks on a first (i.e., initial) layer of a wafer that is allocated for a reticle to expose circuit layout. Then a stepper is used to perform exposing process through the reticle the wafer in step and repeat manner. The stepping exposing pattern has at least one of the align marks overlays with which of an adjacent stepping exposing pattern. The overlaying align marks may be different sizes. Through monitoring relative position of the overlaying align marks by using triangle geometric principle, the angle between the stepping direction of the stepper and the reticle position angle (i.e., the reticle rotating angle) may be obtained. Base on this to monitor the overlaying alignment of the stepper when performing the initial layer exposing process.

The following depicts an example of the triangle geometric principle used in this invention.

Figure 1:
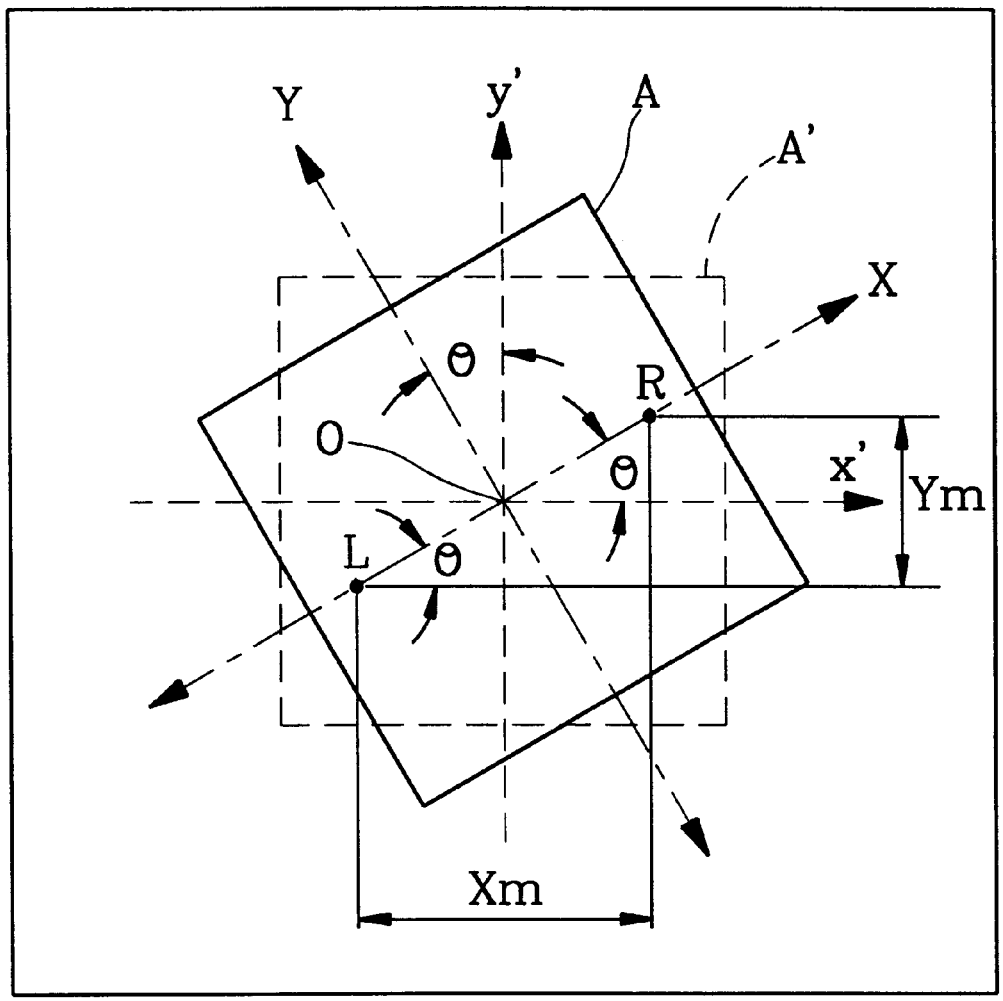
FIG. 1 is a schematic view for calculating a rotating angle of a rectangular member by using triangle geometric principle.

Referring to FIG. 1, when a rectangular frame turns an angle θ counterclockwise from the dash line position A' to a solid line position A about a center point O, the distance between a pair of selected two points L and R on the X-axis will be Xm and Ym in X-axis and Y-axis respectively. The angle θ may be determined by the following equation:

$$\theta = \tan^{-1} \frac{Ym}{Xm}$$

When the frame is turned clockwise, the θ may be designated to negative value. θ is positive when the frame is turned counterclockwise.

Figure 2:
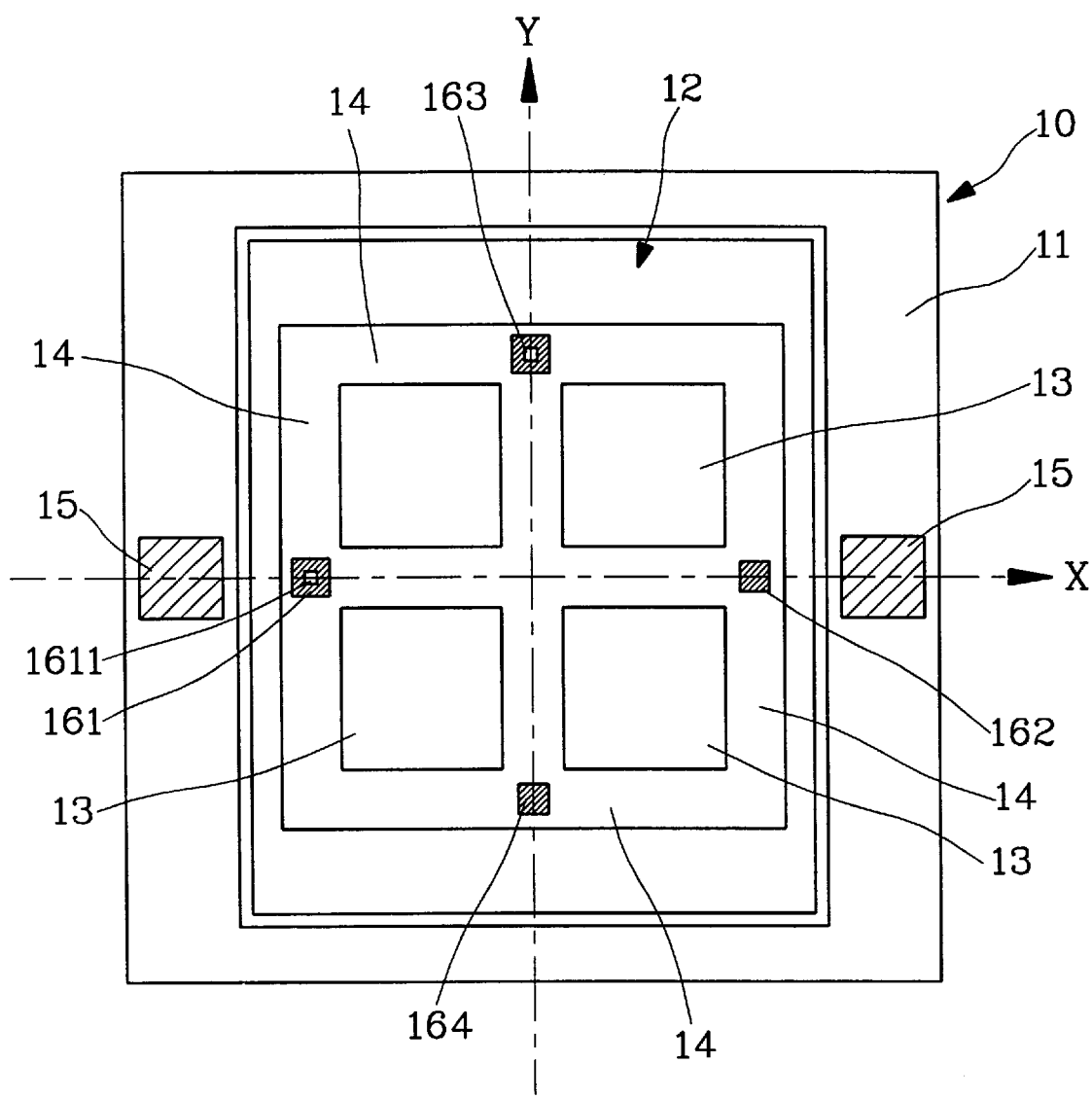
FIG. 2 is a schematic view of a reticle means embodiment of this invention.

Referring to FIG. 2, for an embodiment of this invention, a reticle means 10 includes a rectangular frame 11 which has a rectangular light penetrable zone 12 located therein. In the light penetrable zone 12, there is one or more circuit layout patterns 13 which are to be transferred to a base member (usually a silicon wafer, not shown in the figure) through exposing process by means of a stepper (not shown in the figure). The layout patterns 13 may be square, a 2×2 square matrix as shown in FIG. 2 or other shapes or arrangements desired. In general, a plurality of circuit layout patterns 13 are arranged in matrix manner about the X-Y axis. Between the patterns and between the pattern and an inside rim of the frame 11, there is a spaced interval 14 for cutting a finished wafer to separated and independent dies or chips.

On the frame 11, there may be provided with a plurality of reticle align marks 15 for the reticle positioning use. In the light penetrable zone 12, a plurality of overlay align marks (not shown in the figure) may also be provided for overlay aligning of the second and all other subsequent layers. The arrangement of the reticle align marks 15 and the overlay align marks are known in the art and forms no part of this invention, and thus will be omitted here.

In the light penetrable zone 12, there are at least two align marks located in the interval 14 and preferably on the axis crossing the center of the frame 11, such as a first align mark 161 and a second align mark 162 on the X-axis (i.e., a first straight line direction), and a third align mark 163 and a fourth align mark 164 on the Y-axis (i.e., a fourth straight line direction).

When using the stepper to perform exposing process on a wafer through the light penetrable zone 12 of the reticle 10 for the forming multiple number of substantially identical stepping exposing patterns, any two adjacent exposing patterns will have part thereof being overlaid. Hence align marks 161, 162, 163 and 164 located on the intervals 14 of the frame 11 will have exposing overlay. For instance when the stepper is moved along the X-axis during the stepping exposing process, the first align mark 161 of a pattern will overlay with the second align mark 162 of a previous pattern. When alignment accuracy is totally correct, the overlay of align mark 161 and 162 will be totally matched. However in practice, due to errors in production line and stepper movement, there usually have some overlay variation which makes the first align mark 161 not completely matching with the second align mark 162 of the previous pattern. By means of this invention, that variation (of the reticle position or stepper angle skew) may be calculated and obtained.

In the preferred embodiment shown in FIG. 2, the align marks 161, 162, 163 and 164 are square shaped to facilitate defining the X and Y axes. The second align mark 162 is smaller size than the first align mark 161 so that it can be confined within the boundary of the first align mark 161 during overlay under normal deviation condition (such as angle skew less than five degree). There is further an opaque center mark 1611 in the first align mark 161 that is smaller size than the second align mark 162.

In order to measure the deviation effectively, the exposing value (i.e., light penetration degree) at the align marks 161 and 162 is half of normal exposing value. When align marks 161 and 162 are completely overlayed, the overlay portion gets a normal exposure desired while the center mark 1611 portion gets only half of the normal exposure. Because of this exposure difference, overlay deviation may be easily spotted. Same principle and practice may also be applied to the align marks 163 and 164 on the Y-axis.

There is another method to measure the overlay deviation of the align marks 161 and 162. The align marks 161 and 162 are made opaque while the center mark 1611 is light penetrable. Hence when the align marks 161 and 162 are overlayed, only the center mark 1611 will be exposed while the align marks 161 and 162 areas are non-exposed. The reticle angle skew thus may be spotted easily (as shown in FIG. 3).

The methods set forth above uses zero (opaque) or one (light penetrable), or half exposure to indicate reticle skew deviation. The align marks may be squares or other shapes desired. The location and pattern of the first align mark 161 may be interchanged with the second align mark 162.

Figure 3:
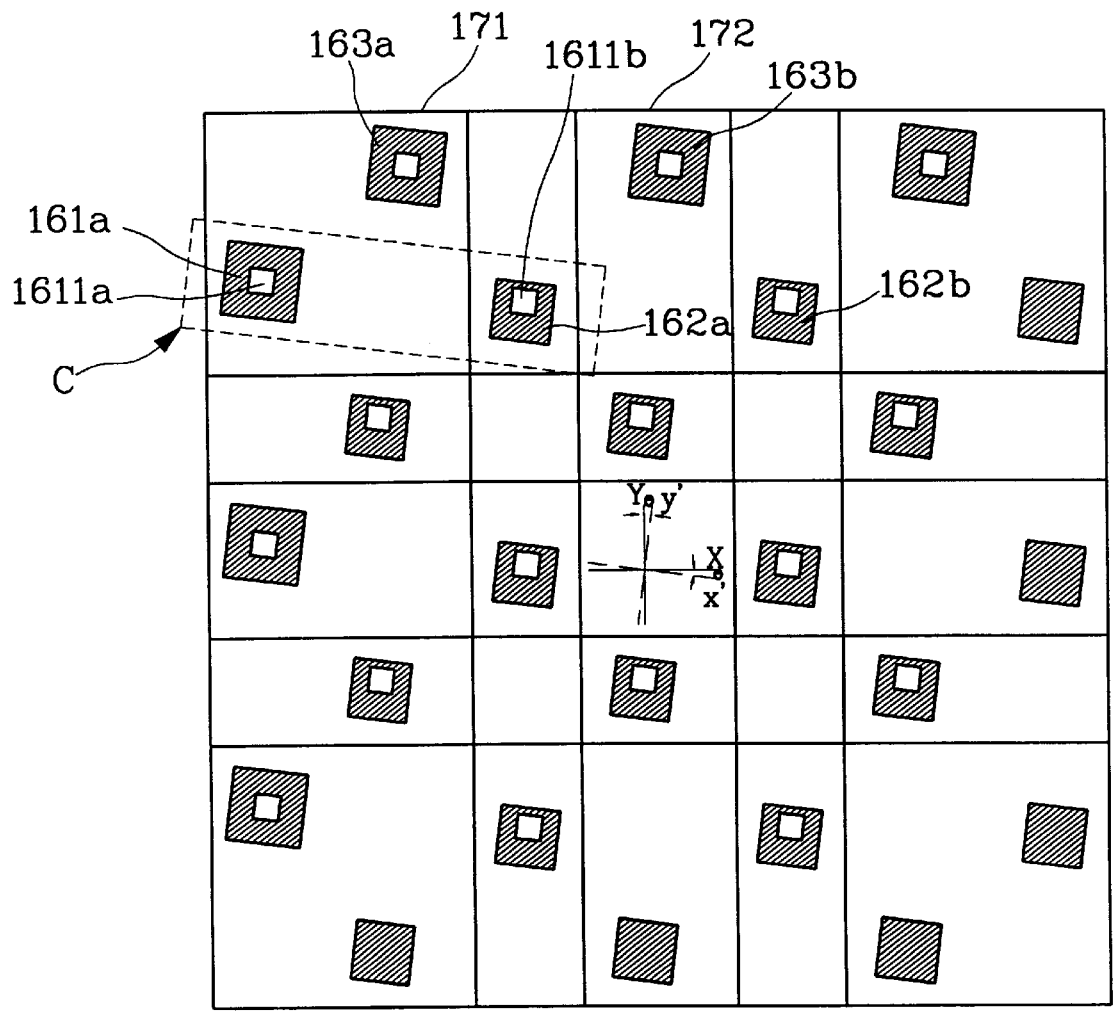
FIG. 3 is a schematic view of using the reticle means of this invention to perform stepping exposing on a base member to obtain overlaying patterns.
Figure 4:
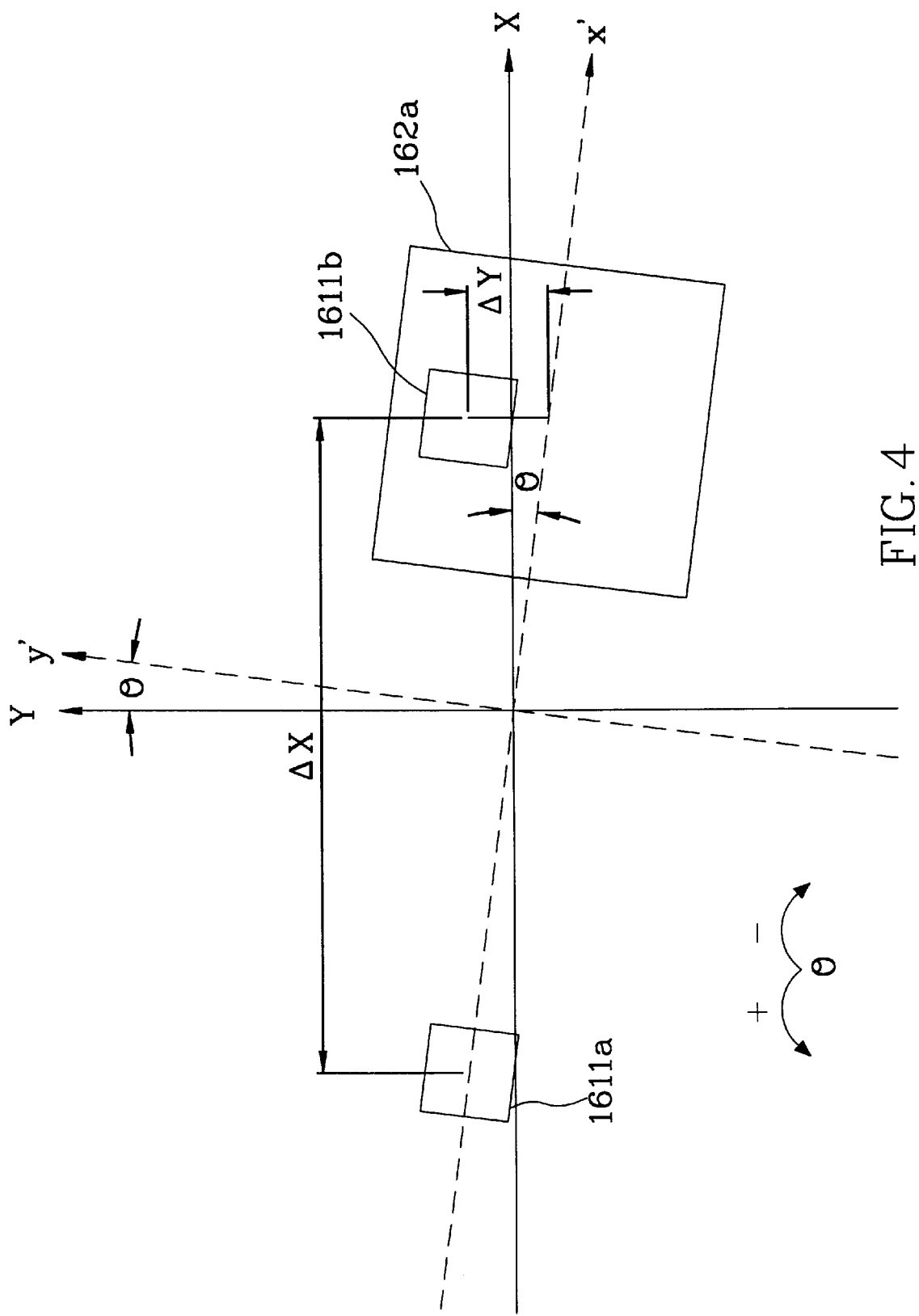
FIG. 4 is a schematic view of using triangle geometric principle for obtaining a rotating angle of the reticle.

FIG. 3 illustrates pattern overlay through a reticle 10. When the reticle 10 positioning does not totally match the stepper moving direction, pattern skew will occur. Taking a small section "C (shown by broken lines)" as an example, and FIG. 4 shows an enlarged details for calculation purpose. The following is the calculation steps:

1. Setting a first straight line in x'-axis direction as the reticle 10 position direction along the line connecting the align marks 161 and 162, and setting the stepper moving direction as a second straight line for X-axis. The stepper moving distance in X-axis is ΔX for each exposing process.
2. Forming a first stepping exposing pattern 171 on a base member (e.g., a wafer, not shown in the FIG.). The pattern 171 includes a first align mark 161a, a second align mark 162a and a third align mark 163a. The first align mark 161a also includes a center mark 1611a therein. Relatively moving the base member against the reticle 10 a distance ΔX from the pattern 171 along the X-axis for forming a second stepping exposing pattern 172 including a first align mark, a second align mark 162b and a third align mark 163b. Since the first align mark of the second stepping exposing pattern 172 overlays on the second align mark 162a of the first stepping exposing pattern 171, therefore the center mark 1611b of the first align mark of the second stepping exposing pattern 172 will right locate within the boundary of the second align mark 162a of the first stepping exposing pattern 171.
3. Projecting the center mark 1611b along a third straight line normal to the second straight line (i.e., parallel to the Y-axis) to the first straight line (i.e., x'-axis), getting the projection distance ΔY.
4. Calculating the angle between the X-axis and x'-axis by the following equation.

$$\theta = \tan^{-1}\frac{\Delta Y}{\Delta X}$$

The value of θ is negative when turning clockwise as shown in FIG. 4.

When the value of θ is known, the parameters of the stepper may be adjusted to control the variation until the θ value becomes zero. Then the pattern overlay can be perfectly matched during the exposing process of the initial layer.

It is noted that, the align marks 161 and 162 are for monitoring overlay alignment of the first layer exposure of the wafer. They are not for stepper recognition use. Nor are they for aligning a stepping exposing pattern of one layer against stepping exposing pattern of a previous layer.

In summary, this invention offers the following advantages:

1. Meet real time control requirements. The align marks is built in the reticle pattern of the manufacturing process. There is no need for a standardized periodical maintenance reticle. The reticle for the initial layer circuit pattern (usually an oxidized layer or a nitride-silicon layer) includes the align marks. Every wafer exposed through that initial layer may be used for overlay alignment of the stepping exposing pattern process. This overlay alignment monitor may be made in real-time frequently (such as several times a day) or periodically as desired.
2. The initial layer circuit layout on the wafer may be made accurately. Through the align marks on the reticle, the accuracy of the first layer exposing pattern may be monitored closely (such as the reticle positioning accuracy and stepping advance accuracy) and may be adjusted constantly. The initial layer pattern may be set accurately. The overlay patterns of subsequently layer thus may be made with less error and thus enhancing production yield.
3. The real-time monitor capability of this invention makes stepper periodical maintenance more flexible and effective. The real-time monitor may be performed without machine down, thus production efficiency may be increased while production cost may be lowered.
4. Different sizes of exposing pattern may be used for the reticle of this invention. Hence same type of equipments may be arranged in mixed manner for overlaying different sizes of exposing pattern.

It may thus be seen that the objects of the present invention set forth herein, as well as those made apparent from the foregoing description, are efficiently attained. While the preferred embodiment of the invention has been set forth for purpose of disclosure, modifications of the disclosed embodiment of the invention as well as other embodiments thereof may occur to those skilled in the art. For instance, the equation for calculating angle θ may use other mathematics equations rather than the triangle geometric equation set forth in the disclosed embodiment. Accordingly, the appended claims are intended to cover all embodiments which do not depart from the spirit and scope of the invention.

What is claimed is:

1. A monitor method for overlay alignment of a stepper, comprising the following steps:
    a. forming a first stepping exposing pattern on a base member through the stepper, the first stepping exposing pattern including a first align mark and a second align mark that defining a first straight line therethrough;
    b. forming a second stepping exposing pattern on the base member along a second straight line and spaced from the first stepping exposing pattern at a selected distance ΔX, defining a third straight line normal to the second straight line, the second stepping exposing pattern being substantially same as the first stepping exposing pattern and also including a first align mark and a second align mark as which of the first stepping exposing pattern, the first align mark of the second stepping exposing pattern being overlaid with the second align mark of the first stepping exposing patter;
    c. projecting a center of the first align mark of the second stepping exposing pattern along the third straight line to the first straight line to obtain a distance ΔY; and
    d. calculating an angle between the first and second straight line by the following equation:

$$\theta = \tan^{-1}\frac{\Delta Y}{\Delta X}$$

where θ is a deviation angle of pattern overlay made by the stepper.

2. The method of claim 1, wherein the first stepping exposing pattern has rectangular border, the first and second align marks being located respectively at a center of two opposite borders, the first straight line being a center line of the first stepping exposing pattern.

3. The method of claim 1, wherein the first align mark and the second align mark are square-shaped of different size.

4. The method of claim 3, wherein during forming the first and second stepping exposing patterns, the exposing value at the first and second align marks is half of normal exposing value so that a normal exposing value will be obtained at a portion where two align marks being overlaid.

5. The method of claim 1, wherein the first and second align marks are square-shaped and have half of normal exposing value, the first align mark having a small size opaque center mark such that when two align marks being overlayed, the overlayed portion having a predetermined exposing value while the center mark having a half exposing value for distinguishing the center mark from the second align mark.

6. The method of claim 1, wherein the first and second align marks are square-shaped and have zero exposing value, the first align mark having a small size and light penetrable center mark such that when two align marks being overlayed, the overlayed portion having zero exposing value while the center mark having a normal exposing value for distinguishing the center mark from the second align mark.

7. The method of claim 1, wherein the first stepping exposing pattern further has a third and forth align marks for defining a fourth straight line normal to the first straight line.

8. The method of claim 7, wherein the third align mark is substantially same as the first align mark, the forth align mark being substantially same as the second align mark.

9. The method of claim 1, wherein the first and second align marks are for monitoring overlay alignment of the exposing pattern of a first layer of the base member but not for the stepper recognition use.

10. The method of claim 9, wherein the first stepping exposing pattern is formed by using the stepper exposing on the base member through a reticle, the reticle further having at least one reticle positioning mark for positing alignment in the stepper.

11. The method of claim 1, wherein the base member is a silicon wafer.

12. A monitor method for overlay alignment of a stepper that includes the stepper to form a plurality of stepping exposing patterns through a reticle on a first layer of a base member, said monitor method comprising the following steps:
    a. forming at least a first align mark and a second align mark on the reticle, the two align marks defining a first straight line therethrough,
    b. operating the stepper to use said reticle to form a first stepping exposing pattern on the base member;
    c. operating the stepper to use the same reticle to form a second stepping exposing pattern on the base member along a second straight line and spaced from the first stepping exposing pattern at a selected distance such that the first align mark of the second stepping exposing pattern overlaying with the second align mark of the first stepping exposing pattern;
    d. calculating a deviation angle between the first and second straight lines by means of a triangle geometric equation; and
    e. adjusting the stepper to maintain the deviation angle within a desired range so that overlaying alignment of stepper exposing is controlled within an allowable limit.

13. The method of claim 12, wherein the deviation angle is calculated by using the triangle geometric equation by the following steps:
    a. forming the second stepping exposing pattern through the reticle on the base member along the second straight line and spaced from the first stepping exposing pattern at a selected distance ΔX;
    b. projecting from the center of the first align mark of the second stepping exposing pattern along a third straight line normal to the second straight line to the first straight line and getting a projection distance of ΔY; and
    c. calculating the deviation angle between the first and second straight line by the following equation:

$$\theta = \tan^{-1}\frac{\Delta Y}{\Delta X}$$

where θ is the deviation angle between the first and second straight line, and is also a deviation angle of overlaying patterns made by the stepper.

14. The method of claim 12, wherein the first stepping exposing pattern has rectangular borders, the first and second align marks being located respectively at a center of two opposite borders, the first straight line being a center line of the first stepping exposing pattern.

15. The method of claim 12, wherein the first align mark and the second align mark are square-shaped of different size.

16. The method of claim 12, wherein the first and second align marks are square-shaped and have half of normal exposing value, the first align mark having a small size opaque center mark such that when two align marks being overlayed, the overlayed portion having a predetermined normal exposing value while the center mark having a half exposing value for distinguishing the center mark from the second align mark.

17. The method of claim 12, wherein the first and second align marks are square-shaped and have zero exposing value, the first align mark having a small size and light penetrable center mark such that when two align marks being overlayed, the overlayed portion having zero exposing value while the center mark having a normal exposing value for distinguishing the center mark from the second align mark.

18. The method of claim 12, wherein the first stepping exposing pattern further has a third and forth align marks for defining a fourth straight line normal to the first straight line.

19. The method of claim 18, wherein the third align mark is substantially same as the first align mark, the forth align mark being substantially same as the second align mark.

20. The method of claim 1, wherein the base member is a silicon wafer.

* * * * *